United States Patent [19]
Howald et al.

[11] Patent Number: 6,125,025
[45] Date of Patent: Sep. 26, 2000

[54] ELECTROSTATIC DECHUCKING METHOD AND APPARATUS FOR DIELECTRIC WORKPIECES IN VACUUM PROCESSORS

[75] Inventors: Arthur M. Howald, Pleasanton; John P. Holland, Santa Clara, both of Calif.

[73] Assignee: LAM Research Corporation, Fremont, Calif.

[21] Appl. No.: 09/163,370

[22] Filed: Sep. 30, 1998

[51] Int. Cl.[7] .................................................. H01T 23/00
[52] U.S. Cl. ............................................ 361/234; 279/128
[58] Field of Search .................... 361/233–235; 279/128

[56] References Cited

U.S. PATENT DOCUMENTS

| | | | |
|---|---|---|---|
| 5,221,450 | 6/1993 | Hattori | 156/643 |
| 5,325,261 | 6/1994 | Horwitz | 361/234 |
| 5,444,597 | 8/1995 | Blake et al. | 361/234 |
| 5,463,525 | 10/1995 | Barnes et al. | 361/234 |
| 5,474,614 | 12/1995 | Robbins | 361/234 |
| 5,507,874 | 4/1996 | Su et al. | 134/1 |
| 5,557,215 | 9/1996 | Saeki et al. | |
| 5,573,981 | 11/1996 | Sato | 361/234 |
| 5,699,223 | 12/1997 | Mashiro et al. | 361/234 |
| 5,708,250 | 1/1998 | Benjamin et al. | 361/234 |
| 5,737,177 | 4/1998 | Mett et al. | 361/234 |
| 5,764,471 | 6/1998 | Burkhart | 361/234 |
| 5,793,192 | 8/1998 | Kubly et al. | |
| 5,818,682 | 10/1998 | Loo | 361/234 |
| 5,838,528 | 11/1998 | Os et al. | 361/234 |
| 5,847,918 | 12/1998 | Shufflebotham et al. | 361/234 |
| 5,880,924 | 3/1999 | Kumar et al. | 361/234 |
| 5,894,400 | 4/1999 | Graven et al. | 361/234 |
| 5,933,314 | 8/1999 | Lambson et al. | 361/234 |
| 5,956,837 | 9/1999 | Shiota et al. | 361/234 |

FOREIGN PATENT DOCUMENTS

| | | |
|---|---|---|
| 0 680 083 | 11/1995 | European Pat. Off. . |
| 0 831 526 | 3/1998 | European Pat. Off. . |
| 7-074231 | 3/1995 | Japan . |
| 97 12396 | 4/1997 | WIPO . |

*Primary Examiner*—Michael J. Sherry
*Attorney, Agent, or Firm*—Lowe Hauptman Gopstein Gilman & Berner

[57] ABSTRACT

A glass workpiece processed in a vacuum plasma processing chamber is dechucked from a monopolar electrostatic chuck by gradually reducing the chucking voltage during processing while maintaining the voltage high enough to clamp the workpiece. The chucking voltage during processing is controlled in response to flow rate of a heat transfer fluid flowing to the chuck to maintain the chucking force and the flow rate approximately constant. A reverse polarity voltage applied to the chuck at the end of processing assists in dechucking. The workpiece temperature is maintained at a high value at the end of processing to assisting in dechucking. Peak current flowing through the chuck during workpiece lifting from the chuck controls the amplitude and/or duration of the reverse polarity voltage during the next dechucking operation. An inert plasma in the chamber removes residual charge from the workpiece after workpiece lifting from the chuck.

42 Claims, 4 Drawing Sheets

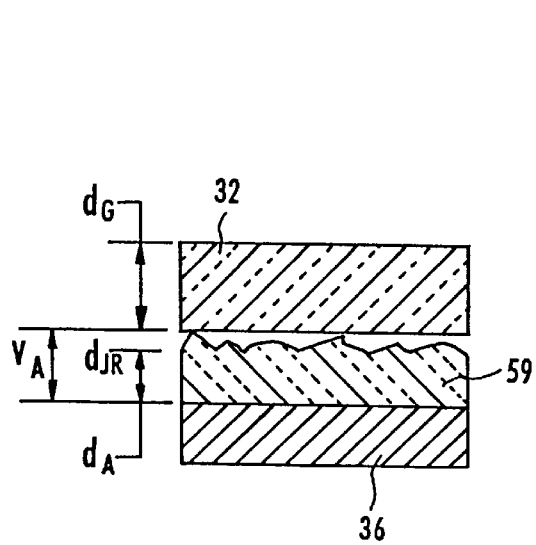
Fig. 4a
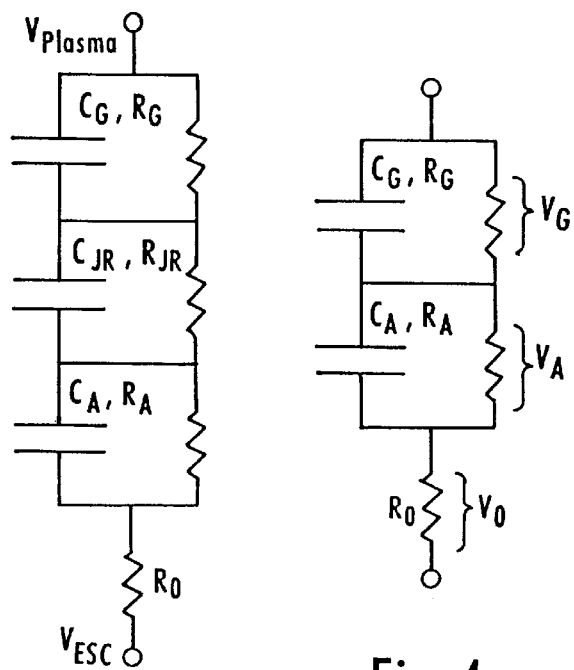
Fig. 4b
Fig. 4c
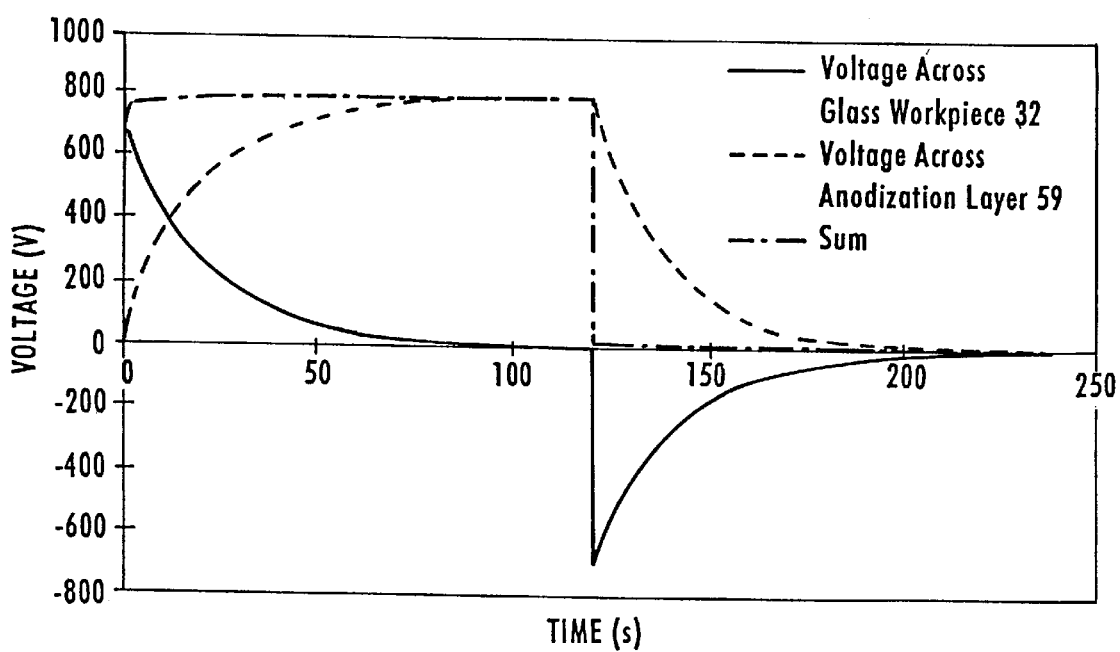
Fig. 5

ELECTROSTATIC DECHUCKING METHOD AND APPARATUS FOR DIELECTRIC WORKPIECES IN VACUUM PROCESSORS

FIELD OF INVENTION

The present invention relates generally to vacuum plasma processors including an electrostatic chuck for holding dielectric workpieces in place during processing and, more particularly, to such a method wherein at least one of plural dechucking processing steps is performed as a function of a determined resistivity range of the workpiece.

An additional aspect of the present invention relates to such processors wherein voltage applied by the electrostatic chuck to the dielectric workpiece is sufficiently high to clamp the processed workpiece but is reduced as a function of time during workpiece processing to assist in releasing the workpiece from the chuck.

Another aspect of the invention relates to such processors wherein an electrostatic chuck particularly designed for dielectric, glass workpieces has a reverse polarity voltage applied to it to assist in releasing the workpiece from the chuck.

A further aspect of the invention concerns such processors wherein dechucking of a dielectric workpiece from an electrostatic chuck is facilitated by preventing a substantial increase in workpiece resistivity upon completion of processing.

An additional aspect of the invention concerns a dechucking method and apparatus wherein the amplitude of a current pulse which is derived as a dielectric workpiece is removed from an electrostatic chuck controls the amplitude and/or duration of a reverse dechucking voltage applied by the chuck to at least one subsequently processed workpiece.

BACKGROUND ART

Vacuum plasma processors include a vacuum chamber containing a workpiece holder, i.e., chuck, for carrying a workpiece having an exposed surface which is plasma processed, i.e., a surface which a plasma etches and/or on which a plasma deposits materials. The etching and depositing are achieved inter alia by ions in a low impedance plasma in the chamber resulting from introducing one or more suitable gases into the chamber and the application of an r.f. field to the gas.

The workpiece temperature is controlled by applying an inert heat transfer gas, such as helium, to the back face of the workpiece. The heat transfer gas improves thermal contact between the workpiece and the chuck which is cooled by water. Typically, the workpieces are relatively thin substrate plates made of electrical conducting materials (i.e., metals), semiconductors or dielectric glass sheets. The workpiece must be clamped to the chuck to hold the workpiece in place against the pressure of the heat transfer gas pushing on the workpiece back face.

Vacuum plasma processing of dielectric glass sheet workpieces has assumed great importance with the introduction of flat panel displays having panels with relatively large dimensions, measured in feet. The co-pending, commonly assigned application of Shufflebotham et al., Ser. No. 08/542,959, now U.S. Pat. No. 5,847,918, filed Oct. 13, 1995, entitled "Electrostatic Clamping Method and Apparatus for Dielectric Workpieces in Vacuum Processors," discloses clamping a dielectric workpiece to an electrostatic chuck in a vacuum plasma processor chamber having a wall at a reference potential. To clamp a dielectric glass workpiece, the low impedance plasma must be incident on a surface of the workpiece exposed to the plasma while a relatively high voltage is applied to a metal electrode plate of the chuck. The electrode is at a voltage substantially different from the plasma while electrostatic charge at approximately the reference potential is applied to the workpiece exposed surface by the low impedance plasma. An electrostatic force is thereby developed between the workpiece and the chuck to clamp the workpiece to the holder.

In a monopolar electrode arrangement disclosed in the aforementioned application, a DC voltage (preferably, but not necessarily, negative) is applied to a metal electrode plate, thence to the workpiece, preferably through a thin protective insulator, preferably formed as an anodized layer on the metal electrode plate. The negative voltage attracts from the plasma net positive charge which settles on the top face of the glass. The attractive force between negative charges on the top of the metal electrode and positive charges on the top of the glass substrate (i.e., workpiece) clamps the glass. Hence, sufficient electrostatic clamping force to hold the substrate on the chuck is applied through the thickness of the workpiece by a voltage difference between the DC voltage applied to the electrode and the approximately DC reference voltage on the workpiece exposed face.

The method and apparatus disclosed in the aforementioned application have been successfully used in many commercial situations for glass dielectric workpieces, such as panels used in flat panel displays. However, when the method and apparatus of the aforementioned application were used in processing glass dielectric workpieces of certain flat panel display manufacturers, the workpieces stuck to the electrostatic chucks and could not be released, i.e. dechucked. Dechucking is performed by lifting the workpiece from the chuck with a mechanical mechanism, usually including pins that are lifted through the chuck into engagement with the bottom face of the workpiece. The mechanism must exert a greater force on the workpiece than the force the chuck applies to the workpiece to release the workpiece from the chuck. However, the force exerted by the workpiece must be low enough to prevent workpiece damage, e.g., breaking, cracking or permanent bending.

Originally the failure to dechuck was thought to be due to a malfunction in the electrostatic chuck. However, when the same glass workpiece was put into a processor having a chuck known to function satisfactorily, the workpiece could still not be dechucked. Our investigations led to the realization that the glass workpiece that could not be dechucked had different passive electric characteristics from the glass workpieces which were successfully dechucked from the prior art electrostatic chucks. The present invention is based, inter alia, on the realization that different glass workpieces used as flat panel displays have different passive electric characteristics, particularly resistivity, which affect dechucking from electrostatic chucks.

Problems have been encountered in the past in dechucking semiconductor wafers from electrostatic chucks. The wafer chucking structures for glass and semiconductor workpieces are similar in that both include a metal electrode covered by an insulator which carries the workpiece. Space in the vacuum between non-contacting portions of the workpiece bottom face and the insulator top face, referred to as a Johnsen-Rahbek gap, enters into an analysis of mechanisms for chucking the different types of workpieces. While there are several ways a silicon wafer can become stuck to an electrostatic chuck, only one (wherein a residual charge left on a capacitor formed between the wafer bottom face and the top face of the insulating layer) is believed relevant to the discussion of the background of the present invention.

The mechanisms for chucking a semiconductor workpiece are substantially different from those of a dielectric workpiece. The mechanisms are such that a substantially higher voltage must be applied to an electrostatic chuck for a dielectric workpiece than is applied to an electrostatic chuck for a semiconductor wafer. Electrostatic chucks for high resistivity glass substrates require higher voltage than electrostatic chucks for silicon wafers because a silicon wafer clamps due to a mutual attraction of opposite polarity charges on the top of the electrode and the bottom of the wafer. These charges are separated by a relatively thin dielectric layer on the chuck electrode. A glass panel, on the other hand, is held in place by a mutual attraction of charges on the top of the chuck electrode and the top of the glass panel. These charges are separated by the thickness of the glass panel, which is much greater than the thickness of the dielectric coating on the electrode. Because of the greater thickness of the dielectric forming the capacitor between the electrode and the top face of the dielectric sheet being chucked than the thickness of the capacitor between the electrode and the bottom face of the relatively low resistivity semiconductor wafer, greater chucking voltage is required for the glass panel than for the wafer.

A negative voltage applied to the metal electrode of a chuck for a semiconductor wafer attracts positive charge from the plasma. The positive charge settles on the exposed top wafer face. While semiconductor materials have a resistivity that is high compared to the resistivity of a metal, the resistivity of a semiconductor material is much lower than that of a dielectric, such as the glass of a flat panel display. The maximum resistivity of a silicon wafer is about one ohm meter so the time constant for positive charge to move between top and bottom faces of the wafer is less than about one microsecond. Since one microsecond is a much shorter time than the typical time required for wafer processing, this charge movement through the wafer is considered to occur instantaneously.

Similarly, there is a tendency for charge on the exposed top surface of a high resistivity glass dielectric sheet to migrate through the glass from the top face of the glass to the glass bottom face. Since the resistivity of the high resistivity glass is much higher than the resistivity of silicon wafers (greater than about $10^{15}$ ohm meters, compared to about one ohm meter) the time scale for the charge migration through the high resistivity glass is about a week. Because the charge migration time through the high resistivity dielectric is much longer than a typical processing time for a glass workpiece, the charge migration through the high resistivity glass can be ignored.

In both of these situations (semiconductor wafers and high resistivity dielectric workpieces) chucking and dechucking of the workpiece occurs for time scales (typically less than one or two seconds) determined by the ability of a source of DC voltage applied to the chuck electrode to provide the necessary charge. Chucking and dechucking of the semiconductor and high resistivity glass workpieces thus does not depend on the very fast or very slow time scales of charges moving between top and bottom faces of the workpieces. In both cases, the charge distribution between the top and bottom faces of the workpiece can be considered as fixed during workpiece processing time. As discussed infra, the charge distribution between the top and bottom faces of dielectric workpieces having low and intermediate resistivities (i.e., between about $10^8$ and $10^{14}$ ohm meters) cannot be considered as fixed during workpiece processing.

Birang et al., U.S. Pat. No. 5,459,632, which appears to have the same disclosure as Birang et al., U.S. Pat. No. 5,612,850, discloses a semiconductor wafer dechucking method wherein a dechucking voltage applied to a monopolar chuck electrode has the same polarity as the polarity of the voltage used to maintain the workpiece in a chucked position. The dechucking voltage has a magnitude different from the chucking voltage to minimize the electrostatic attractive force between the chuck and workpiece. An "optimum" value for the dechucking voltage is determined empirically or by monitoring the amplitude of a current pulse produced as the workpiece is initially mounted on the chuck.

Monitoring the amplitude of the current pulse which flows through the workpiece and the electrostatic chuck when the workpiece is first applied to the chuck is not applicable to processing of glass, dielectric workpieces. This is because no current flows between the electrostatic chuck and the dielectric workpiece when the workpiece is initially placed on the chuck. For glass panels, there is no current pulse when a new panel is first lowered onto the electrostatic chuck. This is because any residual sticking charge on the previously processed dielectric workpiece left with that dielectric workpiece when it was removed from the electrostatic chuck.

As pointed out in Birang et al., U.S. Pat. No. 5,491,603, the method disclosed in the other two Birang et al. patents requires sophisticated measurements of a very short duration electrical pulse. To avoid such sophisticated measuring procedures, the '603 patent discloses a somewhat complex method of calculating the "optimum" voltage by applying an electrostatic potential to the chuck, then introducing a gas between the wafer and chuck and then reducing the electrostatic potential of the chuck while observing a rate of gas leakage from between the wafer and chuck. The optimum dechucking voltage is recorded in a memory as the value of electrostatic potential that occurs when the leakage rate exceeds a predetermined threshold. The calculated optimum voltage is apparently applied to the chuck as or after the plasma is turned off; after the plasma is turned off the wafer is lifted from the chuck. There is no disclosure in the '603 patent of controlling the chucking voltage applied to the chuck during wafer processing in response to the flow rate of gas applied to the workpiece via the chuck during processing. The '603 patent also has no disclosure of maintaining the force applied by the chuck to the wafer substantially constant during wafer processing by a plasma.

In all three Birang et al. patents, which are directed to monopolar chucks for semiconductor wafers, the semiconductor wafer conducts current and trapped charge responsible for a residual clamping force between the workpiece and the electrostatic chuck is conducted through a vacuum gap between the workpiece and top surface of a chuck dielectric layer. Because of the semiconductor wafer conducting properties, the trapped charge which holds the workpiece to the chuck subsists between the workpiece bottom face and the chuck electrode. In contrast, in a glass dielectric workpiece, most of the charge is trapped in the workpiece itself, between the top and bottom faces of the glass dielectric workpiece.

Watanabe et al., U.S. Pat. No. 5,117,121 discloses a method of releasing a semiconductor wafer from a bipolar electrostatic chuck. To clamp the semiconductor wafer workpiece to the bipolar chuck, a DC voltage having a predetermined amplitude and polarity is applied between two chuck electrodes. Because the Watanabe et al. workpiece is a semiconductor wafer, the vast majority of the trapped charge is between the wafer bottom face and the chuck electrode; virtually no charge is trapped between the opposite faces of the workpiece.

After clamping by the DC voltage and before the workpiece is removed from the chuck, a second voltage having a polarity opposite to the polarity of the first voltage is applied to the chuck electrodes to eliminate a residual attractive force which the chuck is applying to the semiconductor workpiece. The second voltage has an amplitude which is one-and-a-half to two times higher than the amplitude of the voltage of the first polarity. The second voltage is continuously applied to the bipolar electrodes for a time period inversely proportional to the amplitude of the second voltage. Apparently, the amplitudes of the first and second voltages are empirically determined. In any event, the amplitudes of the first and second voltages are not determined by an analysis of the passive electric impedance properties of a dielectric, glass workpiece.

It is, accordingly, an object of the present invention to provide a new and improved method of and apparatus for electrostatically chucking and dechucking workpieces in a vacuum plasma processor.

Another object of the invention is to provide a new and improved apparatus for and method of electrostatically chucking and dechucking dielectric glass workpieces, particularly adapted to be used as flat panel displays, in a vacuum plasma processor, wherein during processing, the clamping force exerted by the chuck on the workpiece is sufficient to overcome the tendency of the workpiece to be moved relative to the chuck by cooling gas flowing through the chuck to the workpiece.

A further object of the invention is to provide a new and improved electrostatic chuck apparatus and method used in a vacuum plasma processor for dielectric, glass workpieces of all types, wherein throughput of the workpiece is increased because the workpieces are quickly dechucked.

Still another object of the invention is to provide new and improved methods of dechucking glass, dielectric workpieces from an electrostatic chuck based on an analytic analysis of the workpiece passive electric parameters.

Yet an additional object of the invention is to provide a new and improved method of and apparatus for determining the amount of charge to be removed from a workpiece during dechucking from an electrostatic chuck.

SUMMARY OF THE INVENTION

The invention is applicable to processing a dielectric workpiece by a plasma in a vacuum plasma processor chamber having a metal wall at a reference potential and an electrostatic chuck with an electrode having a face covered by an electrical insulator. Processing is performed after a DC chucking voltage is applied to the electrode while the workpiece is on the chuck. The plasma has sufficiently low electric impedance to cause a front face of the workpiece exposed to the plasma to be at substantially the same potential as the reference potential. A heat exchange fluid, e.g. gaseous helium, supplied to a back face of the workpiece unexposed to the plasma assists in controlling the workpiece temperature while the workpiece is being processed with the plasma; generally the heat exchange fluid cools the workpiece by conducting heat between the workpiece and the relatively low temperature chuck (which is cooled by a liquid). The fluid has a tendency to move the workpiece relative to the chuck. The chucking voltage produces a chucking force on the workpiece to overcome the tendency of the fluid to move the workpiece relative to the chuck.

Passive electrical properties, including resistivity, of the workpiece and insulator, which are determined from measurements or suppliers, are such that if a constant DC chucking voltage were applied to the electrode during workpiece processing, increasing chucking forces would be applied to the workpiece. The chucking forces result from charge in the plasma migrating between the workpiece exposed face and the chuck electrode. The charge migrates through and is stored in the workpiece, the Johnsen-Rahbek gap, and the insulator.

According to one aspect of the invention, one or more dechucking process steps dependent on the determined passive electrical properties, including resistivity, are selected. The selected process step or steps overcome the tendency to produce increasing chucking forces on the workpiece. Then the selected dechucking process step or steps are executed to assist in removal of the workpiece from the chuck when workpiece processing is completed.

If the dielectric workpiece has a low or intermediate resistivity the dechucking steps must be accordingly selected. As is the case for the silicon wafer and high resistivity glass, the chuck electrode voltage (negative in the usual situation, but possibly positive) attracts an opposite polarity charge from the plasma to the top, exposed face of the low or intermediate resistivity glass. The attractive force between the charges on the chuck electrode and the dielectric workpiece holds the workpiece in place on the chuck during workpiece processing. As is the case for the silicon wafer and high resistivity glass, the charge on the low or intermediate resistivity glass has a tendency to move through the glass from its top face to its bottom face.

Because the resistivity of the low and intermediate resistivity glasses is in the range between about $10^8$ to $10^{14}$ ohm meters the charge time constant thereof is in the range of approximately 1 to 5000 seconds. Because this range of time constants includes the approximate lengths of work processing times, the charge distribution on the top and bottom faces of the low and intermediate resistivity glass workpieces is likely to change during workpiece processing.

Shortly after DC voltage is initially applied to the electrode of an electrostatic chuck chucking a low and intermediate resistivity glass workpiece, the charge in the plasma deposited on the exposed glass face remains essentially on the top face and clamping is similar to that for high resistivity glass. After the voltage has been applied to the electrode for a long enough time, e.g., the length of time required to process a low or intermediate resistivity glass workpiece, there is some steady state distribution of charge between the top and bottom faces of the glass workpiece. However, most of the charge is on the bottom face of the workpiece, based on our observation that the combined resistance of the chuck insulation layer and Johnsen-Rahbek gap (the insulation layer and gap can be considered as being in a series circuit) together is greater than the resistance of the glass. Hence, for the same applied chucking voltage there is a higher clamping force after the electrode has been powered for a long time than in situations when the electrode has been powered for a short time. This is because the total amount of the charge (negative on the glass, and positive on the electrode) is larger after the electrode has been powered for a long time than in situations in which the electrode has been powered for a short time.

Because the clamping force of the chuck is approximately proportional to the amount of charge squared, the increased clamping effect (i.e., force) as time progresses is substantial. The amount of charge on the bottom face of the low or intermediate resistivity glass workpieces is greater than for the high resistivity glass. This follows from our observation that with such low and intermediate glasses the capacitance between the electrode and the glass bottom face is higher than the capacitance between the electrode and the glass top face. Since the amount of charge stored on a capacitor is proportional to the capacitance of the capacitor (for the same applied voltage) the clamping force on a low or intermediate glass workpiece is considerably greater than for a high resistivity glass workpiece as time progresses from the initial application of voltage to the chuck electrode.

Because the charge distribution changes appreciably during processing of low or intermediate resistivity glass workpieces, the clamping force increases during processing if a constant DC voltage is applied to the electrostatic chuck. For high resistivity glass, i.e., glass having a resistivity exceeding $10^{15}$ ohm meters, the charge deposited on the exposed, upper glass face by the plasma when the chucking voltage is applied to the electrode is easily and quickly removed by the plasma when the voltage is turned off. Hence, the high resistivity glass workpieces are easily and quickly dechucked. However, for low and intermediate resistivity glasses, the charge that is conducted through the glass workpiece from the workpiece top surface to the workpiece bottom surface with a time constant determined by the capacitance between the top surface of the electrode and the bottom surface of the workpiece, and the resistance between the top and bottom surfaces of the workpiece is typically conducted off the glass in the reverse direction with the same time constant. This time constant, typically between 1 and 5000 seconds, is long enough to cause low and intermediate glass workpieces to become stuck to the electrostatic chuck for some appreciable time after the voltage applied to the chuck electrode has been turned off.

One of the possible dechucking process steps includes reducing the voltage applied to the dielectric workpiece (without reversing the polarity of the voltage) via the electrode and insulator while workpiece processing proceeds. The voltage is reduced so the electrostatic force applied by the electrode to the workpiece via the insulator remains sufficiently high during processing to overcome the tendency of the fluid to move the workpiece relative to the chuck. The chucking voltage decrease is in steps at plural fixed times or is continuous, preferably in an exponential manner, or in a controlled manner to maintain the flow rate of the cooling fluid approximately constant, whereby the electrostatic force applied to the dielectric workpiece remains substantially constant during workpiece processing.

Another of the dechucking process steps includes reversing the polarity of the DC voltage applied to the electrode upon completion of the workpiece processing. The chucking force is thereby reduced to a low enough value to enable the workpiece to be removed from the chuck without damage.

According to a first embodiment, the workpiece is dechucked by applying the reverse polarity voltage to the chuck when processing has been completed, i.e., the polarity of the DC voltage applied to the chuck after processing is opposite to the polarity of the DC voltage applied to the chuck during processing. The reverse voltage magnitude and the time duration the reverse DC voltage is applied to the chuck are such that, once the reverse voltage is terminated, the electrostatic force on the workpiece is reduced sufficiently to enable a lifting mechanism to remove the glass workpiece from the chuck, without (1) causing the workpiece to again stick to the chuck or (2) damaging the workpiece. Preferably in the first embodiment, the amplitude of current flowing through the chuck as a first workpiece is removed from the chuck controls the amplitude of the reverse polarity voltage applied to the electrode and/or the length of time the reverse polarity voltage is applied to the electrode for one or more subsequently processed workpieces. To enable such a current to flow, a plasma must be in the chamber as the first workpiece is removed.

According to a second embodiment, when processing has been completed, a reverse polarity DC voltage is applied to the chuck such that the electrostatic force on the workpiece is reduced to zero while the voltage is still applied, and the workpiece is removed from the chuck. The following steps are preferably performed after the electrostatic force applied to the workpiece is reduced sufficiently to enable the lifting mechanism to remove the workpiece from the chuck: (1) extinguish the plasma, (2) then evacuate the chamber, (3) then remove the workpiece from the chuck, and (4) reduce the voltage applied to the chuck substantially to zero. The voltage applied to the chuck is preferably reduced substantially to zero before the workpiece is removed from the chuck, to prevent damage to the workpiece.

The charge on the dielectric workpiece is preferably reduced substantially to zero after the workpiece has been removed from the chuck by applying an inert plasma, e.g., argon excited to an r.f. plasma or a DC Townsend discharge, to the chamber while the workpiece is therein.

Removal of the dielectric workpiece from the chuck is facilitated by preventing substantial increases of dielectric resistivity after the processing plasma has been extinguished at the completion of workpiece processing. A relatively short time constant for charge removal from the workpiece is attained by preventing increases of dielectric resistivity shortly before workpiece removal. To this end, substantial decreases of workpiece temperature are avoided by stopping the flow of heat transfer gas to the workpiece via the chuck after workpiece processing has been completed.

The above and still further objects, features and advantages of the present invention will become apparent upon consideration of the following detailed description of several specific embodiments thereof, especially when taken in conjunction with the accompanying drawings.

BRIEF DESCRIPTION OF THE DRAWING

FIGS. 4a, 4b and 4c are respectively cross-sectional views of a monopolar electrostatic chuck clamping a glass dielectric workpiece, an equivalent circuit of the chuck clamping the workpiece and an approximate equivalent circuit of the chuck clamping the workpiece;

FIG. 5 is a waveform helpful in describing an embodiment of the invention involving clamping an intermediate resistivity glass workpiece;

DESCRIPTION OF THE PREFERRED EMBODIMENTS

Figure 1:
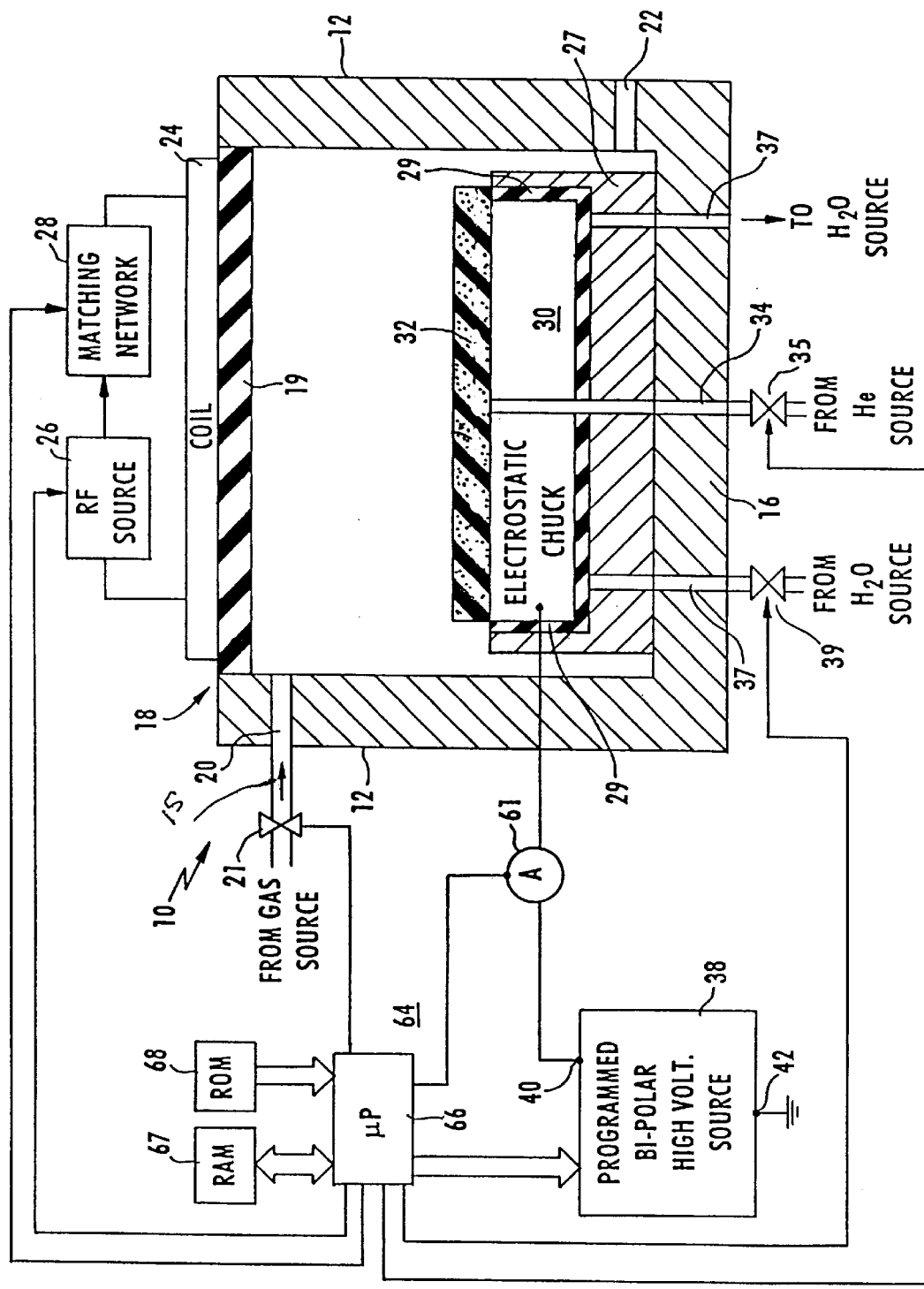
FIG. 1 is a schematic view of a vacuum plasma processor including an electrostatic chuck for holding a glass, dielectric sheet workpiece in situ.

Reference is now made to FIG. 1 of the drawing, wherein a plasma processor that can be used for etching a dielectric substrate or for depositing films on the dielectric substrate is illustrated as including vacuum chamber 10, preferably configured as a right parallel piped having electrically grounded, sealed exterior surfaces formed by rectangular metal, preferably anodized aluminum, sidewalls 12. Vacuum chamber 10 also includes rectangular metal, preferably anodized aluminum, bottom end plate 16 and rectangular top end plate structure 18, including dielectric window structure 19. Sealing of these exterior surfaces of chamber 10 is provided by conventional gaskets (not shown).

A suitable gas that can be excited to a plasma is supplied to the interior of chamber 10 from a gas source (not shown) via line 15, port 20 and valve 21. The interior of chamber 10 is maintained in a vacuum condition, at a pressure typically in the range of 0.5–100 milliTorr, by a vacuum pump (not shown) connected to port 22 in sidewall 12. The gas in vacuum chamber 10 is excited to a plasma condition by a suitable electric source, such as substantially planar coil 24, mounted immediately above window 19 and excited by r.f. source 26 via matching network 28 including automatically controlled reactances (not shown). It is to be understood however that any suitable method of plasma generation can be employed.

Electrostatic chuck 30 is fixedly mounted in chamber 10 on a support structure including grounded metal base 27 that is electrically decoupled from the chuck by electrical insulating sheets 29; base 27 is fixed to bottom end plate 16. Chuck 30 is particularly designed to selectively hold workpiece 32 including a non-plastic dielectric substrate, typically a flat glass substrate sheet used to form a flat panel display. The glass can be any of several different types having determined passive electric characteristics, e.g. determined dielectric constants and resistivities. The glass resistivity is characterized by having one of low, intermediate or high ranges such that the low resistivity is between about $1\times10^8$ and about $1\times10^{11}$ ohm·meters ($\Omega$·m), the intermediate resistivity is between about $2\times10^{11}$ and about $1\times10^{15}$ $\Omega$·m, and the high resistivity exceeds about $1\times10^{15}$ $\Omega$·m.

The resistivities depend on the glass chemical composition and temperature, with resistivity decreasing as temperature increases; all of the glass workpieces decrease in resistivity approximately 2.5 times for each 10° C. temperature increase. The dielectric constants of the glass workpieces range between about 5.6 and 7.7, i.e. are about 6½. The dielectric constants and resistivities of three exemplary types of glasses in the low, intermediate and high resistivity ranges are respectively set forth on the three lines of Table I.

TABLE I

| Glass Type | Dielectric Constant | Resistivity ($\Omega$ · m) | | |
|---|---|---|---|---|
| | | 20 deg C. | 60 deg C. | 80 deg C. |
| Soda lime | 7.6 | $1 \times 10^{11}$ | $4 \times 10^9$ | $8 \times 10^8$ |
| Borosilicate | 6.7 | $5 \times 10^{13}$ | $1 \times 10^{12}$ | $2 \times 10^{11}$ |
| Aluminosilicate | 5.7 | | | $10^{15}$ |

The glass sheets typically have a nominal thickness of 1.1 mm, a thickness tolerance of ±0.1 mm, and very smooth faces, with a maximum peak to peak roughness of 0.02 microns. The glass sheets, as produced, may be slightly warped or wavy. After going through various process steps, especially deposition, the glass sheets can become considerably more warped or wavy, resulting in a greater need to flatten substrate sheet 32 during plasma processing thereof in chamber 10.

The temperature of workpiece 32 typically is controlled to be between 25° and 100° C. by supplying helium gas from a suitable source (not shown) via conduit 34 and valve 35 through chuck 30 to the workpiece back face, i.e., to the face of the glass substrate not exposed to the ions in processing chamber 10, and by supplying a coolant liquid, e.g., a mixture of water and ethylene glycol, to chuck 30 via conduits 37 and valve 39 from a suitable source (not shown). Typically, the pressure of the helium gas applied to the back face of workpiece 32 is in the 5–15 Torr range and the helium flow rate through conduit 34 is in the 5–70 sccm range. The helium flows from the source through a pressure transducer into conduit 34 via a stem and one arm of a "T" connection, the other arm of which is connected through an orifice having a controlled opening to a pump. In all embodiments, the pressure of helium applied to the workpiece back face is maintained substantially constant by a flow controller in conduit 34. For all the coolant flow rates, the pressure of the gas applied to the back face of workpiece 32 is sufficient to push glass sheet 32 off chuck 30, i.e., to move the sheet relative to the chuck, if the chuck applies no electrostatic force to the workpiece. The helium gas cools workpiece 32 by transferring heat, by conduction, between the workpiece and chuck 30. Chuck 30 acts as a relatively cool heat sink because of the liquid coolant flowing to it via conduit 34.

Chuck 30 is constructed so a high thermal conductivity path is provided through the chuck to substrate 32 from the cooling liquid flowing through conduits 37.

The back face of workpiece 32 abuts a flat planar face of chuck 30, except in portions of the chuck face that are grooved. Chuck 30 applies a force to the workpiece so the exposed surface of the workpiece is flat and lies in a plane substantially parallel to the chuck flat planar face. This result is achieved even though workpiece 32 may be warped or wavy when put onto the chuck and despite the tendency of the helium gas flowing through conduit 34 to bow the workpiece upwardly into chamber 10 away from the flat planar face of chuck 30. Chuck 30 is also constructed so the helium gas contacts a substantial portion of the back face of workpiece 32 even though the back face of the workpiece abuts ungrooved portions of the flat planar face of chuck 30.

Figure 2:
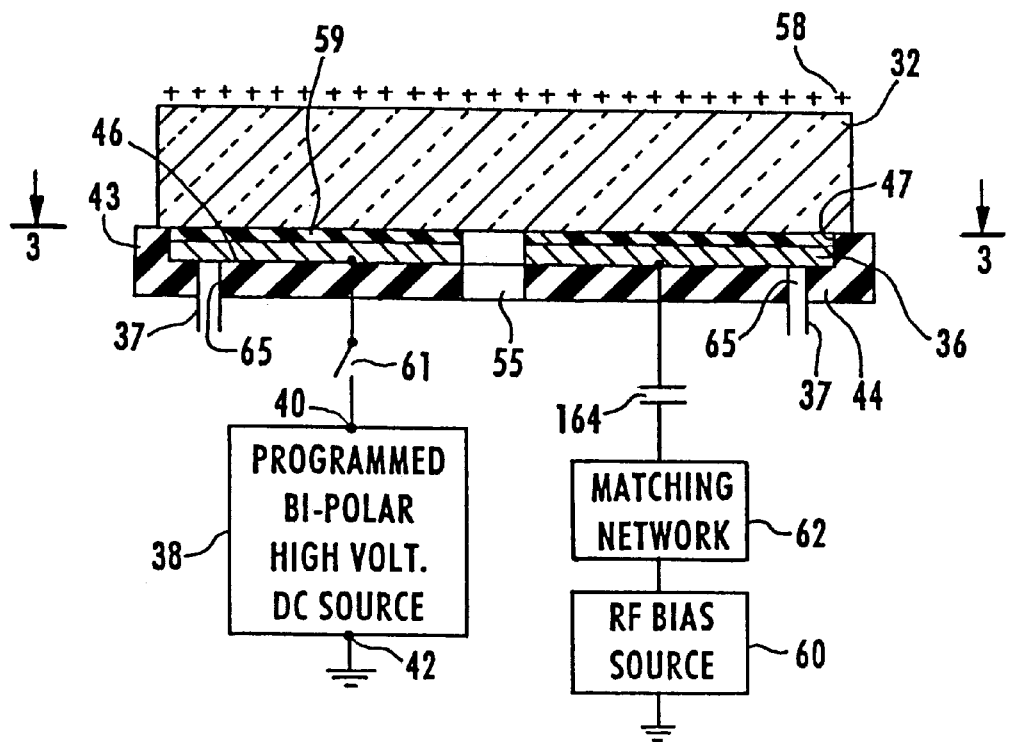
FIG. 2 is a side sectional view of a monopolar electrostatic chuck embodiment particularly adapted to be used in the processor of FIG. 1, in combination with the glass, dielectric sheet workpiece.
Figure 3:
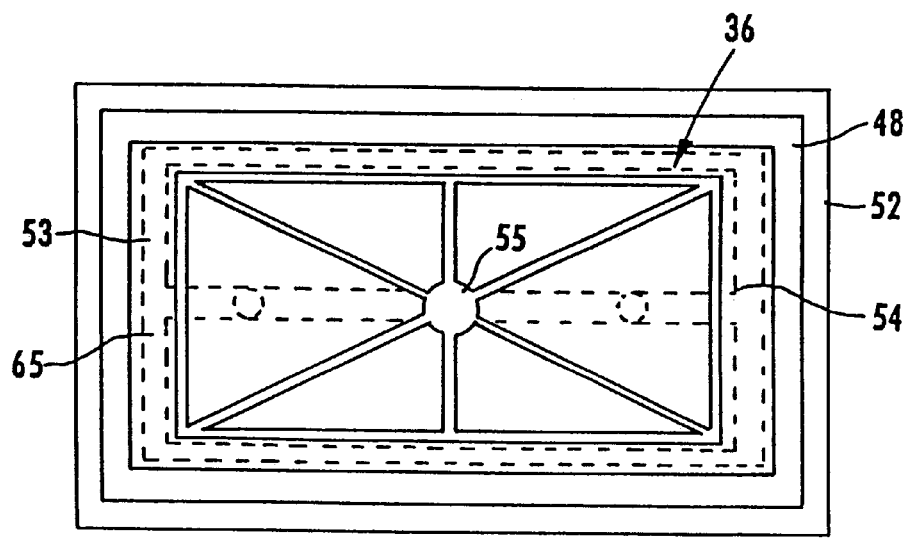
FIG. 3 is a top view of the structure illustrated in FIG. 2, without the glass, dielectric sheet workpiece in situ.

As illustrated in FIGS. 2 and 3, electrostatic chuck 30 is a monopolar device having only one electrode formed as high electrical conductivity metal (preferably aluminum) plate 36, connected to high voltage terminal 40 of programmed DC source 38, including a low pass r.f. rejection filter (not shown). During initial processing of workpiece 32 by the plasma in chamber 10 the voltage at terminal 40 is typically several thousand volts, e.g., 5000 volts, relative to the voltage of source 38 at grounded terminal 42, connected to a metal wall of housing 10. Terminal 42, chamber 10 and the plasma in the chamber are all at about the same DC ground (i.e., reference) potential. Voltage source 38 can be constructed so terminal 40 is at either a negative or positive voltage relative to the voltage at grounded terminal 42. During processing of workpiece 32 by the plasma in chamber 10 the voltage at terminal 40 is preferably negative with respect to terminal 42 to attract relatively low mobility positive ions to the exposed face of workpiece 32. The negative polarity is advantageous because it reduces the likelihood of deleterious effects on power supply 38.

A radio frequency bias voltage is supplied to chuck for ion energy control. To this end, r.f. source 60 is connected via matching network 62 and series DC blocking capacitor 164 to plate 36 of chuck 30. The AC bias voltage causes chuck 30 to become charged to a negative DC voltage because the highly mobile plasma electrons are attracted to the chuck to a much greater extent than the low mobility heavy plasma ions.

The front of plate 36, i.e. the face of the plate closest to glass workpiece 32, is covered by protective electric insulator 59, preferably formed as an anodized, non-outgassing layer completely covering the plate 36 front face. Insulator layer 59 typically has a thickness of about 0.1 mm, and determined passive electric parameters, e.g. determined dielectric constant and resistivity which lead to determined capacitance and resistance.

The remainder of plate 36 is surrounded by dielectric electric insulator body 44, also made of a material which does not out-gas (usually not a plastic and preferably a ceramic). Body 44 prevents electrode plate 36 from electrically contacting the ions in chamber 10 so there is a substantial DC potential difference between the electrode and ions in the chamber. To this end, insulator body 44 is shaped as a plate having recess 46 therein. Metal plate 36 is located in recess 46 such that peripheral edges of the plate abut interior walls 47 of flanges 48 of body 44 and workpiece 32 is sized relative to plate 36 so the substrate completely covers the plate 36 upper surface.

To enable helium gas flowing through conduit 34 to contact a substantial portion of the back face of glass workpiece 32, smooth planar upper face 53 of plate 36 is provided with spaced, interconnected grooves 54 (FIG. 3), all of which are in fluid flow relation with each other and conduit 34. Conduit 34 effectively extends through chuck 30 by virtue of the chuck including central bore 55 to which the conduit and grooves are connected. When workpiece 32 is clamped in place on chuck 30, the exposed planar upper face of the workpiece extends in a plane parallel to upper face 53. Insulator body 44 includes passages 65, in fluid flow relation with conduits 37 so the coolant liquid flows through the passages. Heat is readily transferred from workpiece 32 to the coolant in passages 65 since insulator body 44 and metal plate 36 have a high thermal conductivity and there is a short distance between the passages and workpiece 32.

In operation, a glass dielectric substrate workpiece 32, of the types described supra, is placed on insulating layer 59 when the voltage of DC source 38 connected to electrode 36 is zero by virtue of the DC source being disconnected from its energizing power supply (not shown). After workpiece 32 has been placed on layer 59 completely surrounded by dielectric body 44, source 38 is connected to its energizing power supply. Cooling gas is then supplied to conduit 34 by opening valve 35.

Workpiece 32 is placed on chuck 30 by a robotic arm (not shown) that delivers the workpiece to a set of vertically driven metal, lifting pins (not shown) that are electrically connected to chuck electrode 36 and extend vertically through the chuck and are raised above the chuck top face. Because workpiece 32 is glass, the workpiece bottom face is at a voltage independent of the voltages of electrode 36 and the lifting pins. When the pins are lowered, workpiece 32 rests on insulator 59 and is spaced from the pins. After processing has been completed, sometimes while a small clamping force is applied by chuck 30 to workpiece 32, the workpiece is removed from the chuck by raising the pins against the workpiece. The pins then return the processed workpiece to the robotic arm.

Charge layer 58 forms on the exposed, top surface of glass workpiece 32 because the exposed surface contacts ions substantially at the reference potential in chamber 10. Consequently, layer 58 is at a reference potential close to the ground voltage of chamber 10. When source 38 is turned on and switch 61 closed, current flows from terminal 40 to electrode 36, displacement current flows from electrode 36 through insulating layer 59 and glass workpiece 32, and current flows from the exposed top layer of workpiece 32 through the plasma in chamber 10 to the chamber walls, thence to the ground terminal 42 of source 38 to complete the circuit. This current flow results in charging of the dielectric of a capacitor formed between electrode 36 and the top surface of workpiece 32. The voltage of source 38 is sufficiently high that the charge on the dielectric of the capacitor formed between the electrode 36 and the top surface of workpiece 32 produces an attractive force between workpiece 32 and electrode 36 sufficient to clamp the workpiece to chuck 30.

The voltage of source 38 is sufficiently high that the charge across the thickness of workpiece 32 produces an attractive force across the workpiece to clamp the workpiece (i.e., substrate) to the upper face 53 of insulating layer 59. The value of the voltage of source 38 (typically on the order of 5000 volts) required to clamp glass dielectric workpiece 32 is considerably higher than the voltage required to clamp a semiconductor or metal workpiece to a monopolar electrostatic clamp. The high voltage is necessary to establish the clamping pressure from electrode plate 36 across the thicknesses of workpiece 32 and insulating layer 59 to the charge layer on exposed face of the workpiece. Usually the clamping force applied to workpiece 32 is about twice the force applied to the backside of the workpiece by the He flowing through conduit 34.

For the low and intermediate resistivity glass workpieces, there is a tendency for charges and voltages to remain on workpiece 32 when processing is completed; the charge and voltage stay on the glass workpiece as the pins raise the workpiece from chuck 30. When glass workpiece 32 is not completely released from chuck 30 and when the processing plasma is on to complete the electrical circuit, charge is trapped on the bottom of the glass workpiece, and image charges form on the top of the glass workpiece and on electrode 36. The image charge is on electrode 36 because the image charge is attracted to the trapped charge on the bottom face of workpiece 32.

As workpiece 32 is lifted from chuck 30 while a plasma is in chamber 10 to maintain the workpiece upper face at the reference voltage, charge is transferred between electrode 36 and the workpiece top face because the capacitance between the electrode and the workpiece bottom face decreases. Consequently a current pulse flows between electrode 36 and the bottom face of glass workpiece 32 as the pins lift the glass workpiece from chuck 30.

The amplitude of the current pulse is monitored by ammeter 61, connected between plate 36 and terminal 40 of source 38. The peak reading of meter 61 is directly proportional to the residual voltage and charge on workpiece 32 as the pins lift the workpiece from chuck 30. Alternatively, the instantaneous amplitude of the current sensed by meter 61 is detected for a predetermined period starting a few microseconds after the pins begin to lift workpiece 32 and ending before the pulse is over. The instantaneous output of meter 61 is integrated during the period. Computer system 64 determines peak amplitude or integrates the value of current sensed by meter 61. As described infra, computer system 64 responds to the reading of meter 61 to control the clamping force chuck 30 applies to at least one subsequently processed glass workpiece 32 while such a workpiece is removed from the chuck.

Computer system 64, including microprocessor 66, random access memory (RAM) 67 and read only memory (ROM) 68, controls the amplitude of a time varying voltage derived by source 38, opening and closing of valves 21, 35 and 39, as well as turning on and turning off of r.f. source 26 and the reactive impedances of matching network 28. Microprocessor 66 responds to a program stored in ROM 68, to signal values stored in RAM 67, and to the amplitude of the current in the pulse sensed by ammeter 61 to control valves 21, 35, 39, high voltage source 38 and r.f. source 26. In addition, microprocessor 66 responds to values of (1) output power of source 26 and (2) power reflected back to the source, as derived from suitable transducers (not shown), to control the reactances of matching network 69. The operations stored in ROM 68 to control source 38, valves 21, 35 and 39, as well as energization of source 26, are described infra. The operations performed by microprocessor 66, except for control of the reactances of matching network 28, can also be performed manually.

The different types of glass workpieces used for flat panel displays have different passive electric properties, e.g., resistivities and capacitances, that affect dechucking glass substrates 32 from chuck 30. High resistivity glass dielectric substrates 32, when clamped to chuck 30, are easily released from the substrate when the voltage applied by source 38 to the chuck is reduced to zero. As indicated supra, we found that low and intermediate resistivity dielectric workpieces 32 are not released from chuck 30 when the high voltage applied to the chuck is reduced to zero. The differing resistivities, in particular, affect the charges stored in the glass dielectric workpieces and can adversely effect the ability to remove the workpieces quickly from chuck 30.

FIGS. 4a, 4b and 4c are respectively (a) a cross-sectional view of chuck 30 (including metal plate 36 and insulator layer 59) and clamped glass dielectric workpiece 32, (b) an approximate equivalent circuit diagram of the structure of FIG. 4a and (c) an approximate circuit diagram of the structure of FIG. 4a. The structure illustrated in FIG. 4a, in addition to comprising insulator 59 between metal plate 36 and glass 32, includes a vacuum gap between the insulator top face and the glass workpiece 32 bottom face. the gap is frequently referred to as a Johnsen-Rahbek gap. Insulator 59, the gap and glass workpiece 32 have known approximate thicknesses of $d_A$, $d_{JR}$, and $d_G$, respectively. The impedance to DC source 38 of each of insulator 59, the gap and glass workpiece 32 can be represented as a capacitor in parallel with a resistor; the capacitors and resistors are respectively represented in FIG. 4b by $C_A$, $R_A$ for the capacitance and resistance between the top face of electrode plate 36 and the top face of insulator layer 59, $C_{JR}$, $R_{JR}$ for the capacitance and resistance between the top face of insulator layer 59 and the bottom face of glass workpiece 38, i.e., of the Johnsen-Rahbek gap, and $C_G$, $R_G$ for the capacitance and resistance between the top and bottom faces of glass workpiece 32. The parallel equivalent passive circuit components of insulator 59, the Johnsen-Rahbek gap and glass workpiece 32 are series connected to each other. The top face of glass workpiece 32 is at the approximately reference (i.e., ground) voltage of the plasma in chamber 10. The bottom face of insulator layer 59 is connected to the power supply voltage ($V_{ESC}$) of DC source 38 through electrode plate 36 and resistor $R_0$, equal to the resistance of the source. The bottom face of workpiece 32 is at some voltage between the voltage of source 38 and the exposed face of the workpiece during processing.

For intermediate and low resistivity glass workpieces, as described supra in connection with Table I, the Johnsen-Rahbek gap resistance is much greater than the resistance of insulator layer 59, which in turn is greater than the resistance of dielectric glass workpiece 32. For the time scales of interest, involved in dechucking low and intermediate resistivity glass dielectric workpieces from chuck 30, the combination of insulator layer 59 and Johnsen-Rahbek gap 30 can be treated as a single layer having a resistance and capacitance equal approximately to the insulator resistance ($R_A$) and the insulator capacitance ($C_A$).

This leads to the approximate equivalent circuit illustrated in FIG. 4c, wherein the parallel combination of the capacitance $C_A$ and resistance $R_A$ of insulator 59 is in series with the parallel combination of the capacitance $C_G$ and resistance $R_G$ of glass workpiece 32. The series combination of FIG. 4c, i.e., $C_A$ in parallel with $R_A$ and $C_G$ in parallel with $R_G$, is in series with resistor $R_0$, the resistance of source 38. (The circuitry of FIG. 4C and the resulting calculations are approximate because they treat the resistances of workpiece 32 and insulator 59 as ohmic which is not actually the case. However, the circuitry of FIG. 4C and the resulting calculations are accurate enough to be useful because they show there are fast and slow time constants and a voltage polarity reversal when the voltage of source 38 is no longer applied to chuck 30.)

The current from source 38 establishes the time varying voltages $V_0$, $V_A$ and $V_G$ which are, respectively, (1) across resistor $R_0$, (2) between the top face of metal plate 36 and the bottom face of glass workpiece 32 (i.e., across insulator layer 59), and (3) across glass workpiece 32. The voltage applied by source 38 to the electrostatic chuck including plate 36, insulator 59 and the glass dielectric workpiece 32 is $$V_{ESC}=(V_0+V_G+V_A+V_{plasma})$$

where $V_{plasma}$ is the voltage the plasma applies to the top, exposed face of glass dielectric substrate 32.

The clamping force applied to glass workpiece 32 is $$F = \epsilon_0 k_A^2 V_A^2(t)\frac{A}{2d_A^2}\ldots, \tag{1}$$

where $k_A$ is the dielectric constant of insulator layer 59, $\epsilon_0$ is the permittivity of free space, and A is the area of the bottom face of glass workpiece 32 which is substantially equal to the area of the top face of insulator layer 59.

In response to a step voltage change of source 36 causing a step voltage transition of $V_{ESC}$, the value of $V_A(t)$ is:

$$V_A(t)=C_A{}^+\exp(-A^+t)+C_A{}^-\exp(-A^-t)+V_{A\infty} \tag{2}$$

where:

$A^\pm=(f_G r_G+f_A r_A \pm s)/2$, $C_A{}^\pm[A^\pm(V_{A\infty}-V_{A0})+f_A(r_A\ V_{A0}+V_{G0}-V_{ESC}+V_{plasma})]/(\pm s)$ $f_G=1/(C_G R_0)$, $f_A=1/(C_A R_0)$, $r_G=(1+R_0/R_G)$, $r_A=(1+R_0/R_A)$, s=sqrt $((f_G r_G-f_A r_A)^2+4f_G f_A)$, (sqrt signifies square root)

$V_{A\infty}=V_2(t\rightarrow\infty)$, $V_{A0}=V_A(t=0)$, $V_{G0}=V_G$ (t=0)

The time constant $\tau^+=1/A^+$ is typically less than 1 second and corresponds to charging the series combination capacitance $(C_G{}^*C_A)/(C_G+C_A)$ through external resistance $R_0$.

Time constant $\tau^+$ governs changes in the total voltage of the equivalent circuit defined by $(V_G+V_A)$ and is the appropriate turn-on time constant for chuck 30 to workpiece 32. Changes that occur with time constant $\tau^+$ involve movement of equal amounts of displacement charge through both capacitors $C_A$ and $C_G$.

The discharge time constant of electrostatic chuck 30 and dielectric workpiece, $\tau^-=1/A^-$, is for the free flow of charge onto the series capacitors $C_G$ and $C_A$ through resistors $R_0$, $R_A$ and $R_G$. The discharge time constant $\tau^-$ approximately equals the product of (1) the smaller of the resistances of insulator 59 or glass workpiece 32 and (2) the larger of the capacitances of insulator 59 or workpiece 32. The smaller resistance and larger capacitance are respectively $R_G$ and $C_A$. The product $R_G C_A$ for the intermediate resistivity workpieces is typically orders of magnitude greater than $\tau^+$. $\tau^-$ is the time constant usually governing gradual increases in the clamping force of glass substrate 32 to electrostatic chuck 30, and the decay of the residual clamping force applied by chuck 30 to workpiece 32 after the voltage of source 38 has dropped to zero.

The effects of the two time constants $\tau^-$ and $\tau^-$ are illustrated by the waveforms of FIG. 5, analytic solutions for the voltages $V_G$ and $V_A$ as a function of time for step changes from $V_{ESC}=0V$ to $V_{ESC}=800V$ for $0<t<120$ s after the positive step change, and from $V_{ESC}=800$ to $V_{ESC}=0$ after 120 s. For FIG. 5, $C_A$ is 20 times larger than $C_G$, $R_A$ is an order of magnitude greater than $R_G$, the time constant $\tau^+$ is 0.04 s, and the time constant $\tau^-$ is 20 s. These component and time constant values are for a temperature of 40° C. for a particular intermediate resistivity glass used for commercial flat panel displays. When the 800V level is applied to insulator 59 while the workpiece 32 exposed face is at ground, the voltage sum $(V_G+V_A)$ rapidly increases to 800V with the time constant $\tau^+$. The initial voltage division between $V_G$ and $V_A$ is established by the capacitive voltage divider ratio. After initial turn on of the 800V source, $V_G$ decreases and the clamping voltage $V_A$ increases toward the resistive voltage divider values of the glass workpiece and insulator with the time constant $\tau^-$. At t=120 s, the ESC voltage is turned off, i.e., ESC=0, and the sum voltage rapidly decreases to zero with the time constant $\tau^+$. The voltage on the capacitor $C_A$ or $C_G$ with the smaller product $C_A*R_A$ or $C_G*R_G$ changes polarity with the smaller $\tau^-$ time constant, and then the voltages on both capacitors decay with the longer time constant $\tau^-$.

Since the resistivity of different glasses used in the manufacture of flat panel displays varies by over five orders of magnitude (as indicated by Table I), the time constant $\tau^-$ is also highly variable, and no one dechucking procedure is effective for all types of glass.

Since $R_A C_A > R_G C_G$ for low and intermediate resistivity glass workpieces clamped to chuck 30, the clamping voltage $V_A$ applied by electrode 36 through insulator 59 to the bottom face of such workpieces increases with time after chuck 30 has been supplied by source 38 with a constant amplitude DC voltage. To attain a suitable dechucking time, it is desirable during workpiece processing by the plasma to maintain the clamping voltage $V_A$ at an approximately constant value sufficient to cause workpiece 32 to remain stuck in situ against the force of the cooling fluid flowing through conduit 37. This can be achieved by reducing, as a function of time, the value of the voltage applied by source 38 to chuck 30 after the workpiece has been clamped.

Ideally, the value of $V_{ESC}$ derived by source 38 is reduced exponentially, to maintain the chucking voltage $V_A$ and chucking force substantially constant during processing of the dielectric, glass workpiece 32. However, it is somewhat difficult to program an exponential function into ROM 68 and to control the amplitude of a high voltage source so it is an exponentially decreasing function of time. The exponential decreasing voltage and the effects attained thereby can be approximated to a large extent by ROM 68 storing a program which causes microprocessor 66 to control source 38 so the source derives a sequence of time spaced decreasing step voltages during processing of glass, dielectric workpiece 32 by the plasma in chamber 10. For example, the exponential decreasing voltage during processing can be approximated by source 38 initially applying a voltage of −1500 volts to plate 36 during the first 15 seconds of glass dielectric workpiece processing. ROM 68 then controls microprocessor 64 to cause the output voltage of source 38 to decrease to −800 volts for a period subsisting between 15 and 45 seconds of workpiece processing. Then ROM 68 controls microprocessor 66 so the voltage of source 38 drops to −600 volts during the interval of 45 to 75 seconds of processing time. After 75 seconds of processing time, ROM 68 causes microprocessor 66 to drop the output voltage of source 38 to −500 volts. With relatively short processes, having a duration on the order of 60 seconds, such a processing sequence can cause the stored clamping charge in insulator 59 to be sufficiently low as to enable glass workpiece 32 to be lifted from the insulator without damage. This process is particularly applicable for intermediate resistivity glass workpieces. The high resistivity glass workpieces need not employ the programmed voltage source and the prior art, constant voltage technique is suitable for dechucking purposes.

In accordance with a further embodiment, the voltage of source 38 is continuously controlled while workpiece 32 is being processed so the clamping force chuck 30 applies to the workpiece is approximately constant. Such a result is achieved by controlling the voltage of source 38 to maintain the flow rate of helium coolant flowing through conduit 34 against the back face of workpiece 32 constant, at a set point value, whereby the clamping force is substantially constant during workpiece processing.

To this end, flow sensor 70 is connected in helium conduit 34 between value 35 and bore 55. Sensor 70 develops a signal proportional to the helium flow rate as averaged over a relatively long time interval, e.g., a few seconds. The averaged output of sensor 70 effectively indicates the chucking force chuck 30 applies to workpiece 32. The signal is supplied to an input of microprocessor 66 where it is compared with a preset flow rate signal value stored in ROM 68. The comparison results in a relatively long time constant control that microprocessor 66 continuously supplies to source 38 so the source voltage is varied to maintain the clamping force chuck 30 applies to workpiece 32 approximately constant during workpiece processing. Microprocessor 66 is preferably programmed to control the voltage of source 38 by applying an error (difference) signal resulting from the comparison to a proportional, integral, differential (PID) controller. Short time constant control is provided by a conventional pressure sensor (not shown) responsive to the gas pressure exerted by the helium gas on the back face of substrate 32. The pressure sensor, in combination with microprocessor 66 controls the pressure of the helium gas supplied to valve 35 and line 34.

Control of the voltage of source 38 in response to the output signal of sensor 70 is based on the realization that the helium flow rate (1) decreases in response to increases of clamping force by chuck 30 on workpiece 32 and (2) increases in response to decreases of clamping force by chuck 30 on workpiece 32. As soon as source 38 initially applies a constant DC voltage to chuck 30, the clamping force applied to workpiece 32 begins to increase exponentially, causing the flow rate of coolant through conduit 34 to decrease. The decreased flow rate is detected by sensor 70, to cause microprocessor 66 to decrease the DC voltage that source 38 applies to chuck 30 so the chucking force remains approximately constant. Operation continues in this manner throughout the time workpiece 32 is processed.

For many intermediate and low resistivity glass workpieces, particularly those processed by the plasma for more than one minute, the charge stored in the workpiece at the completion of the processing interval is likely to be sufficiently large to prevent the workpiece from being removed by the pins from chuck 30, even though the voltage supplied by source 36 to the workpiece has decreased as a function of time. In these situations, after workpiece processing has been completed and while a low power plasma is in chamber 10 so the voltage at the workpiece exposed face is approximately zero, ROM 68 activates microprocessor 66 to cause source 38 to supply to terminal 40 a DC voltage having a polarity opposite to the polarity of the voltage supplied to terminal 40. The opposite, i.e., reverse, polarity voltage is applied after the voltage of source 36 has been reduced during processing.

In accordance with a second embodiment, the amplitude of the reverse polarity voltage supplied by source 38 to terminal 40 is predetermined at a relatively high value, such as +4000 volts; the +4000 volt value is applicable to a situation wherein the voltages of source 36 are sequentially −1500V, −800V, −600V and −500V during processing. The reverse polarity voltage magnitude is selected to be such that $V_A$ (the voltage between the top face of electrode 36 and the bottom face of glass workpiece 32) is zero, which causes a substantial increase in $V_G$ (the voltage between the top and bottom faces of glass workpiece 32).

The magnitude of the reverse polarity voltage must be sufficient to attain this result, bearing in mind that the relative impedances of insulator 59 and glass workpiece 32 are such that only 5% to 10% of the voltage of source 38 is developed across capacitor $C_A$. This dechucking method is for cases when the regular dechucking time constant $\tau^-$ is very long. The very long time constant $\tau^-$ can come about, for example, if the glass workpiece becomes stuck during high temperature processing. The high temperature reduces the workpiece resistivity and thus causes the sticking/dechucking time constant to be faster than at lower temperatures.

However, after processing the plasma is extinguished which causes dechucking to take place at a lower temperature which causes a much slower time constant. Even though it would take a very long time for all the charges on all of the capacitors to decay to zero with time constant $\tau^-$, the voltage on any one particular capacitor can still be reduced to zero at the fast time constant $\tau^-$, at the expense of increasing the voltages on other capacitors. However, this method can be used to free a stuck workpiece, since only the voltage $V_A$ (in this equivalent circuit model) is directly related to the sticking force. For this dechucking method, there is not any particular length of time for which the reverse polarity voltage should be applied, other than a time longer than $\tau^-$.

After the voltage across capacitor $C_A$ drops to zero, the plasma in chamber 10 is turned off by microprocessor 66 closing valve 21 and turning off r.f. source. Then microprocessor 66 activates a pump (not shown) to pump out chamber 10 to a pressure less than 1 milliTorr (preferably, at least an order of magnitude less than 1 milliTorr) while electrode 36 is still connected to voltage source 38. This causes the circuit through the plasma to chamber walls 12 to be broken. Then microprocessor 66 commands the voltage of source 38 to be reduced to zero. The value of voltage $V_A$ remains zero and the value of voltage $V_G$ remains relatively large.

Then microprocessor 66 commands the lifter pins to remove glass workpiece 32 from chuck 30; the voltage $V_G$ (the voltage between the top and bottom faces of glass workpiece 32) remains quite high even after the pins lift the workpiece from chuck 30. Microprocessor 66 then performs operations causing the value of voltage $V_G$ to be reduced substantially to zero by causing formation of an inert plasma in chamber 10. The plasma is preferably formed by introducing an inert ionizable gas, e.g., argon, into chamber 10 and applying an r.f. field to the gas from source 26, via matching network 28 and coil 24. Alternatively, the charge on lifted workpiece 32 is removed by igniting a DC Townsend discharge in chamber 10.

The steps can be rearranged so the workpiece 36 is removed from chuck 30 before the chucking voltage of source 36 applied to electrode 32 is reduced to zero. Then the pins lift glass substrate 32 from chuck 30 when the reverse polarity voltage has been on for a sufficient length of time to cause the voltage of capacitor $C_A$ to be approximately zero. If the voltage of source 38 was not previously reduced to zero, the voltage of the source is then reduced to zero.

In a first reverse polarity embodiment, the reverse polarity voltage is supplied by source 38 to plate 36 until substantially equal charges are present on capacitors $C_A$ and $C_G$, i.e., there is charge balance between capacitor $C_A$ (defined by the volume between the bottom face of insulator 59 and the bottom face of workpiece 36) and capacitor $C_G$ (defined by the volume between the bottom and top faces of workpiece 32). When there are approximately equal charges across capacitors $C_A$ and $C_G$ the voltage across capacitor $C_A$ is $$V_A = \frac{V_G C_G}{C_A}.$$

ROM 68 is programmed so that when $$V_A = \frac{V_G C_G}{C_A},$$

microprocessor 66 reduces the voltage of source 38 at terminal 40 to the ground potential at terminal 42. After the voltage at terminal 40 has been reduced to zero, the voltages $V_A$ and $V_G$ decay quickly with the short time constant $\tau^-$.

Based on the determined values of $R_G$, $R_A$, $C_G$ and $C_A$, the value of $V_A$ is calculated for glass workpieces having differing resistivities and capacitance. From the calculated values of $V_A$, time durations are calculated to reach the balanced charge condition for different values of reverse polarity voltages at terminal 40 at the completion of workpiece processing. These times are stored in ROM 68 and supplied to microprocessor 66 to control the length of time the reverse voltage is applied by source 38 to plate 36 via terminal 40. If, for example, the applied reverse voltage has a magnitude of 4,000 volts, equalization of charge in $C_G$ and $C_A$ is achieved in 53 seconds for a particular glass workpiece. At 53 seconds, the voltage between the upper and lower faces of such a workpiece 32 is about −3,830 volts, while the clamping voltage between the lower face of insulator 59 and the lower face of the workpiece is about −170 volts. When charge equalization occurs, microprocessor 66 reduces the voltage of source 36 to zero and the clamping voltage $V_A$ discharges quickly to zero. Then lifting pins remove workpiece 32 from chuck 30.

The charge balancing embodiment is particularly applicable to low resistivity glass workpieces. The reverse polarity voltage is left on for a long enough time to prevent the workpiece from sticking. The charge balancing reverse polarity embodiment is associated with the discharge time constant $\tau^-$.

In the charge balancing embodiment the voltage approximately equals the ratio of the voltages $$\frac{|V_{ESC}|}{V_A}$$

at the start of the reverse polarity process. The ratio $$\frac{|V_{ESC}|}{V_A}$$

can be as high as the capacitance ratio $$\frac{C_A}{C_G}.$$

The charge balancing reverse polarity process therefore decreases the length of time of the dechucking operation by a factor of 10 or 20 times. For low resistivity glass workpieces, this means the workpiece is released in approximately 50 seconds, instead of almost 1,000 seconds. However, the charge balance reverse polarity process is excessively long for glass workpieces having intermediate resistivities.

The reverse polarity voltage in the first reverse polarity embodiment preferably has a magnitude controlled by the amount of clamping charge on capacitor $C_A$ (between the lower face of insulator 59 and the lower face of workpiece 32) as workpiece 32 is lifted from chuck 30. Since the passive electric parameters of the glass workpieces in a particular batch are similar and resistivity is a function of workpiece temperature, the amount of charge on capacitor $C_A$ for a particular workpiece at the time the workpiece is lifted from chuck 30 preferably controls the amplitude of the reverse polarity voltage applied by source 38 to chuck 30 for the next processed workpiece. In fact, the charge on capacitor $C_A$ at the time a particular workpiece is removed from chuck 30 can be used to control the magnitude and/or duration of the reverse polarity voltage during removal of the next several (e.g., up to about 10) workpieces 32 from chuck 30.

To monitor the charge on capacitor $C_A$ at the time a particular workpiece 32 is lifted from chuck 30, ammeter 61 responds to the current pulse flowing through terminal 40 and plate 36 of chuck 30 while the lifting pins remove the particular workpiece 32 from chuck 30 while an inert r.f. plasma is in chamber 10. The inert r.f. plasma is applied to the chamber after plasma processing has been completed and the processing plasma has been extinguished. Microprocessor 66 responds to the peak current pulse amplitude or the integrated current detected by meter 61 to control the amount of charge applied during one or more subsequent reverse polarity voltage steps. The amount of charge difference applied by the reverse polarity voltage relative to the last time meter 61 controlled the reverse voltage charge is inversely proportional to the current meter 61 detects relative to the previous detected reading of meter 61.

In the first embodiment, the reading of meter 61 controls the amplitude of the reverse polarity voltage and/or the length of time the reverse polarity voltage is applied by source 38 to chuck 30. Ideally, no current flows if the substrate was perfectly dechucked. If the most recent peak current increases in amplitude relative to the immediately preceding peak current, microprocessor 66 increases the amplitude of the applied reverse voltage and/or the length of time the reverse voltage is applied. If, however, the most recent peak current is negative in amplitude relative to the immediately preceding peak current, microprocessor 66 decreases the amplitude of the applied reverse polarity voltage and/or the length of time the reverse polarity voltage is applied to chuck 30.

Figure 6:
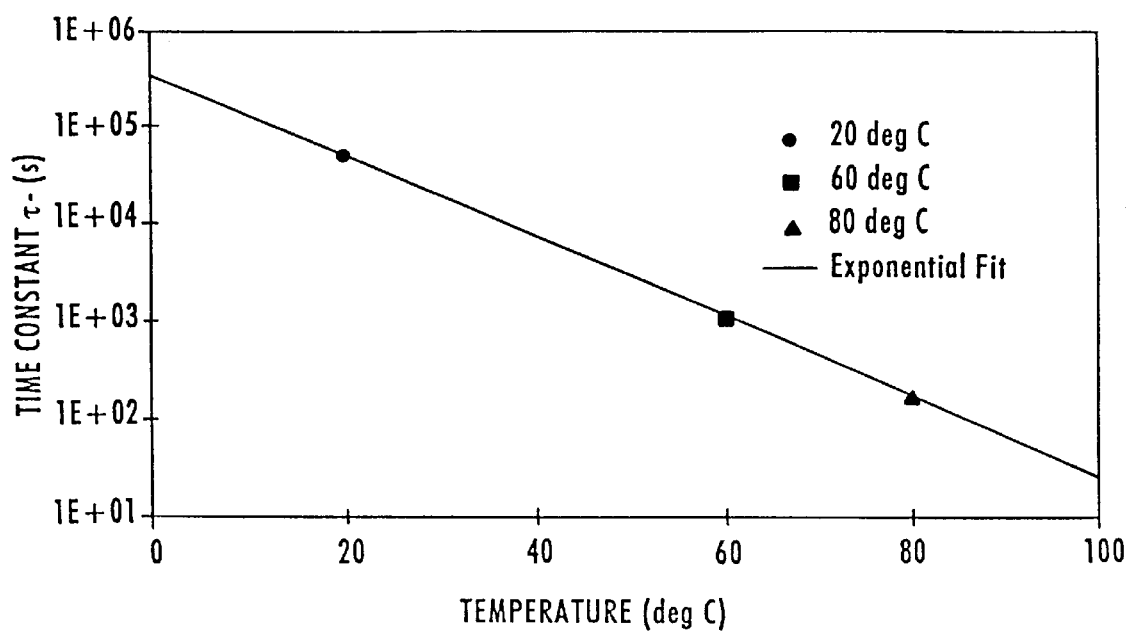
FIG. 6 is an approximate equivalent plot of discharge time constant ($\tau^-$) as a function of temperature for a typical intermediate resistivity glass workpiece.
Figure 7:
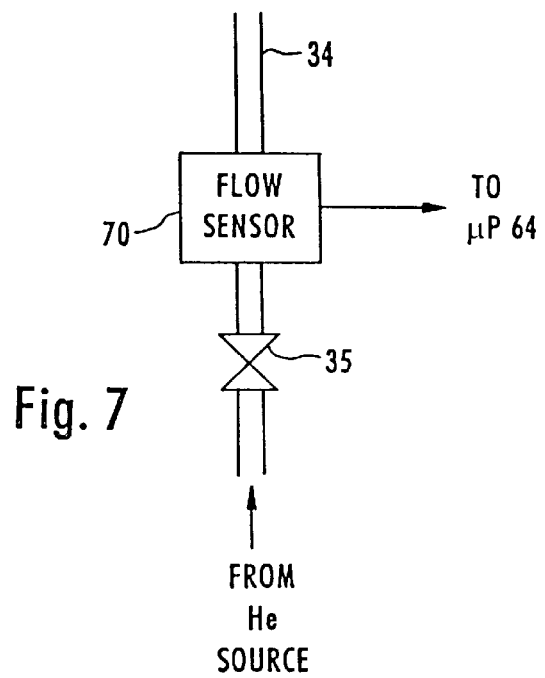
FIG. 7 is a partial schematic view of a feature of the invention wherein the voltage applied to the chuck during processing is controlled to maintain the coolant flow rate constant.

The electrical resistivity of low and intermediate resistivity dielectric glass workpieces strongly depends on workpiece temperature as shown by Table I (supra). FIG. 6 is a plot of the discharge time constant $\tau^-$ for a typical intermediate resistivity glass as a function of temperature. Since resistivity decreases approximately 2.5 times for every 10° C. increase in glass workpiece temperature, warm glass workpieces tend to dechuck more quickly than cool glass workpieces stuck by the same initial force to the chuck. To take advantage of this phenomenon, workpiece temperature is maintained approximately constant at a high level or is increased somewhat upon the completion of workpiece processing, until dechucking is completed.

During processing of workpiece 32, the plasma elevates the workpiece temperature to a relatively high value, such as 80° C. At 80° C., glass workpiece 32 has a significantly lower resistivity than the glass has at lower temperatures, such as 20° C. However, completion of processing of workpiece 32 is accompanied by ROM 68 supplying microprocessor 66 with signals causing closure of valve 21 in the process gas supply conduit and cutoff of r.f. source 26, to extinguish the plasma in chamber 10. Because the plasma is extinguished, the temperature of workpiece 32 tends to decrease.

To maintain workpiece 32 at the elevated temperature after workpiece processing has been completed, ROM 68 supplies microprocessor 66 with a signal which causes the microprocessor to close valve 35 in helium cooling line 34 substantially simultaneously with plasma extinction. The workpiece remains at the relatively high temperature and low electrical resistivity it had at the end of processing because there is poor thermal contact between workpiece 32 and chuck 30 when no helium flows into the chuck. The low electrical resistivity enhances dechucking of workpiece 32 from chuck 30 during the reverse polarity procedure.

After the reverse polarity procedure has been completed for the second embodiment and while the pins position workpiece 32 above chuck 30, charge between the top and bottom faces of workpiece 32 is removed by turning on a low power inert plasma for a few seconds, as described supra. The charge across workpiece 32 can also be dissipated in this way by establishing a DC Townsend discharge across the faces of the glass workpiece by introducing an ionizable gas, such as argon or oxygen at a pressure of a few milliTorr, into chamber 10 via valve 21. For the first reverse voltage embodiment, the plasma is on while the pins lift the workpiece to remove the charge between the workpiece top and bottom faces.

While there have been described and illustrated specific embodiments of the invention, it will be clear that variations in the details of the embodiments specifically illustrated and described may be made without departing from the true spirit and scope of the invention as defined in the appended claims.

We claim:

1. A method of processing a dielectric workpiece in a vacuum plasma processor chamber having a metal wall at a reference potential and an electrostatic chuck with an electrode comprising applying the workpiece to the chuck, applying a DC chucking voltage to the electrode while the workpiece is on the chuck, processing the workpiece with a plasma in the chamber, the plasma having sufficiently low electric impedance to cause a front face of the workpiece exposed to the plasma to be at substantially the same potential as the reference potential, controlling the workpiece temperature while the workpiece is being processed by the plasma by supplying a heat transfer fluid to a back face of the workpiece unexposed to the plasma, the fluid having a tendency to move the workpiece relative to the chuck, the chucking voltage producing a chucking force on the workpiece to overcome the tendency of the fluid to move the workpiece relative to the chuck, the workpiece and insulator having determined passive electrical properties, including resistivity, the passive electrical properties being such that chucking charge derived by the chucking voltage is conducted through the dielectric workpiece from its exposed to its unexposed surface during processing of the workpiece so that application of a constant DC chucking voltage to the electrode during processing of the workpiece tends to produce increasing chucking forces on the workpiece, selecting at least one of plural dechucking processing steps dependent on the determined passive electrical properties, the selected at least one dechucking processing step being known to facilitate removal of the workpiece from the chuck despite the tendency to produce increasing chucking forces on the workpiece, and executing the at least one selected dechucking process step to facilitate removal of the workpiece from the chuck when workpiece processing is completed.

2. The method of claim 1 wherein one of the selected dechucking processing steps includes reducing the DC chucking voltage applied to the electrode during workpiece processing while maintaining the voltage applied to the electrode sufficiently high to overcome the tendency of the fluid to move the workpiece relative to the chuck.

3. The method of claim 1 wherein one of the selected dechucking processing steps includes reversing the polarity of the DC voltage applied to the electrode upon completion of workpiece processing, then causing the chucking force to be reduced to a low enough value to enable the workpiece to be removed from the chuck without damage, and then removing the workpiece from the chuck.

4. The method of claim 1 wherein one of the selected dechucking processing steps includes preventing the temperature of the workpiece from dropping substantially after workpiece processing by the plasma has been completed such that resistivity of the workpiece is at least one order of magnitude less than room temperature resistivity upon the completion of workpiece processing and until dechucking has been completed.

5. The method of claim 1 wherein one of the selected dechucking processing steps includes preventing the temperature of the workpiece from decreasing substantially upon the completion of workpiece processing and until dechucking has been completed, the workpiece temperature being controlled so that during processing and until dechucking has been completed the workpiece temperatures does not increase to a value that causes deleterious effects to the workpiece or structures formed on the workpiece during processing.

6. The method of claim 1 wherein one of the selected dechucking processing steps includes applying a DC voltage having a polarity opposite to the DC chucking voltage to the electrode after plasma processing of the workpiece has been completed, the opposite polarity voltage having an amplitude such that the voltage between the electrode and the unexposed face drops approximately to zero.

7. The method of claim 6 wherein the following steps are performed after the opposite polarity voltage is applied to the electrode: (a) extinguishing the plasma, (b) then lowering the chamber pressure, after the chamber pressure has been lowered (c) removing the workpiece from the chuck, and (d) reducing the voltage applied to the chuck substantially to zero.

8. The method of claim 7 wherein the voltage applied to the chuck is reduced substantially to zero before the workpiece is removed from the chuck.

9. The method of claim 7 wherein the voltage applied to the chuck is reduced substantially to zero after the workpiece is removed from the chuck.

10. The method of claim 7 further including removing charge from the workpiece after the workpiece has been removed from the chuck.

11. The method of claim 10 wherein the charge is removed from the workpiece by igniting a gas in the chamber to a plasma.

12. A method of processing a dielectric workpiece in a vacuum plasma processor chamber having a metal wall at a reference potential and an electrostatic chuck with an electrode comprising applying the dielectric workpiece to the chuck, applying a DC chucking voltage to the electrode, the chucking voltage being applied to the electrode while the workpiece is on the chuck, processing the workpiece with a plasma in the chamber, the plasma having sufficiently low electric impedance to cause a front face of the workpiece exposed to the plasma to be at substantially the same potential as the reference potential, cooling the workpiece while the workpiece is being processed with the plasma by supplying a cooling fluid to a back face of the workpiece unexposed to the plasma, the fluid having a tendency to move the workpiece relative to the chuck, the chucking voltage producing a chucking force on the workpiece to overcome the tendency of the fluid to move the workpiece relative to the chuck, the workpiece and an insulator between the electrode and a back face of the workpiece unexposed to the plasma having capacitances and resistances such that chucking charge derived by the chucking voltage is conducted through the dielectric workpiece from its exposed to its unexposed surface during processing of the workpiece so that application of a constant DC chucking voltage to the electrode during processing of the workpiece tends to produce increasing chucking forces on the workpiece, and substantially overcoming the tendency to produce increasing chucking forces on the workpiece by reducing the voltage applied to the chuck during workpiece processing while maintaining the electrostatic chucking force applied by the electrode to the workpiece via the insulator sufficiently high to overcome the tendency of the fluid to move the workpiece relative to the chuck.

13. The method of claim 12 further including reversing the polarity of the DC voltage applied to the electrode upon completion of processing of the workpiece, then reducing the chucking force to a low enough value to enable the workpiece to be removed from the chuck without damage, and then removing the workpiece from the chuck.

14. The method of claim 13 further including monitoring the amplitude of current flowing through the chuck as the workpiece is being removed from the chuck, controlling the reverse polarity voltage applied to the electrode of at least one subsequently processed workpiece in response to the monitored current amplitude, the controlled reverse polarity voltage having an amplitude and duration to cause the force applied by the chuck to the at least one subsequently processed workpiece to be substantially zero when the at least one subsequently processed workpiece is removed from the chuck.

15. The method of claim 14 wherein at least one of the amplitude and duration of the reverse polarity voltage is controlled in response to the monitored current amplitude.

16. The method of claim 15 wherein the amplitude of the reverse polarity voltage applied to the electrode during the dechucking of the at least one subsequently processed workpiece is controlled.

17. The method of claim 15 wherein the length of time the reverse polarity voltage is applied to the electrode during dechucking of the at least one subsequently processed workpiece is controlled.

18. The method of claim 15 wherein the amplitude of the reverse polarity voltage and the length of time the reverse polarity voltage is applied to the electrode during dechucking of the at least one subsequently processed workpiece is controlled.

19. The method of claim 12 further comprising substantially removing charge from the workpiece after the workpiece has been processed and while the workpiece is in the chamber.

20. The method of claim 19 wherein the charge is removed by a discharge in the chamber.

21. The method of claim 20 wherein the discharge is a plasma excited by an AC source.

22. The method of claim 20 wherein the discharge is a DC Townsend discharge across opposed faces of the workpiece, the DC Townsend discharge resulting from introduction of ionizable gas into the chamber.

23. The method of claim 12 further including preventing the temperature of the workpiece from dropping substantially after workpiece processing by the plasma has been completed such that resistivity of the workpiece is at least one order of magnitude less than room temperature resistivity upon the completion of workpiece processing and until dechucking has been completed.

24. The method of claim 12 further including monitoring the amplitude of current flowing through the chuck as the workpiece is being removed from the chuck, and controlling voltage applied to the electrode of at least one subsequently processed workpiece in response to the monitored current amplitude.

25. The method of claim 12 further including monitoring the flow rate of fluid flowing to the workpiece back face during workpiece processing, controlling the amplitude of the DC chucking voltage applied to the electrode during workpiece processing in response to the flow rate monitored during workpiece processing to control the electrostatic force applied to the workpiece via the electrode and insulator during workpiece processing.

26. The method of claim 25 wherein the DC chucking voltage amplitude is controlled by the monitored flow rate so the cooling fluid flow rate remains approximately constant during workpiece processing.

27. A method of processing a glass workpiece having a resistivity of up to about $10^{14}\Omega\cdot m$ in a vacuum plasma processor chamber having a metal wall at a reference potential and an electrostatic chuck with an electrode comprising applying the workpiece to the chuck, applying a DC chucking voltage to the electrode while the workpiece is on the chuck, processing the workpiece with a plasma in the chamber, the plasma having sufficiently low electric impedance to cause a front face of the workpiece exposed to the plasma to be at substantially the same potential as the reference potential, controlling the workpiece temperature while the workpiece is being processed with the plasma by supplying a heat transfer fluid to a back face of the workpiece unexposed to the plasma, the fluid having a tendency to move the workpiece relative to the chuck, the chucking voltage producing a chucking force on the workpiece to overcome the tendency of the fluid to move the workpiece relative to the chuck, the workpiece and an insulator between the electrode and the workpiece back face having capacitances and resistances such that chucking charge derived by the chucking voltage is conducted through the dielectric workpiece from its exposed to its unexposed surface during processing of the workpiece so that application of a constant DC chucking voltage to the electrode during processing of the workpiece tends to produce increasing chucking forces on the workpiece, and reversing the polarity of the DC voltage applied to the electrode upon completion of the workpiece processing to then reduce the chucking force to a low enough value to enable the workpiece to be removed from the chuck without damage, and then removing the workpiece from the chuck.

28. The method of claim 27 wherein the reverse polarity voltage is applied while the workpiece is exposed to the plasma.

29. The method of claim 28 wherein the reverse polarity voltage is applied until the charge across the workpiece and the insulator are approximately equalized, then reducing the voltage applied to the chuck to zero.

30. The method of claim 27 further including reducing the workpiece voltage to zero as the workpiece is removed from the chuck.

31. A method of processing a dielectric workpiece in a vacuum plasma processor chamber having a metal wall at a reference potential and an electrostatic chuck with an electrode comprising applying the workpiece to the chuck, applying a DC chucking voltage to the electrode, the chucking voltage being applied to the electrode while the workpiece is on the chuck, processing the workpiece with a plasma in the chamber, the plasma having sufficiently low electric impedance to cause a front face of the workpiece exposed to the plasma to be at substantially the same potential as the reference potential, and facilitating removal of the workpiece from the chuck by preventing a substantial decrease in workpiece resistivity after the plasma has been extinguished.

32. The method of claim 31 wherein the step of preventing a substantial decrease in workpiece resistivity includes preventing a substantial decrease in workpiece temperature after the plasma has been extinguished.

33. The method of claim 31 further including controlling the workpiece temperature while the workpiece is being processed by the plasma by supplying a heat transfer fluid to a back face of the workpiece unexposed to the plasma via the chuck and supplying a coolant to the chuck, the workpiece being cooled by a transfer of heat from the cooled chuck via the fluid to the workpiece, and the step of preventing a substantial decrease in workpiece temperature including stopping the flow of the fluid to the back face of the workpiece.

34. A method of processing a dielectric workpiece in a vacuum plasma processor chamber having a metal wall at a reference potential and an electrostatic chuck with an electrode comprising applying the workpiece to the chuck, applying a DC chucking voltage to the electrode, the chucking voltage being applied to the electrode while the workpiece is on the chuck, processing the workpiece with a plasma in the chamber, the plasma having sufficiently low electric impedance to cause a front face of the workpiece exposed to the plasma to be at substantially the same potential as the reference potential and extinguishing the plasma to complete processing of the workpiece, then removing the workpiece from the chuck, charge developed across the workpiece during workpiece processing having a tendency to remain on the workpiece after removal of the workpiece from the chuck, and removing the charge remaining on the workpiece by applying an inert plasma to the chamber while the workpiece is in the chamber and removed from the chuck.

35. Apparatus for processing a dielectric workpiece comprising a vacuum plasma processor chamber having a metal wall at a reference potential, an electrostatic chuck in the chamber, the chuck including an electrode, a DC chucking voltage source connected to the electrode, a plasma source for processing the workpiece in the chamber, the plasma of the source having sufficiently low electric impedance to cause a front face of the workpiece exposed to the plasma to be at substantially the same potential as the reference potential, a heat transfer fluid source for a back face of the workpiece unexposed to the plasma, the fluid when applied to the workpiece back face having a tendency to move the workpiece relative to the chuck, the chucking voltage having a value for producing a chucking force on the workpiece to overcome the tendency of the fluid to move the workpiece relative to the chuck, the workpiece and an insulator between the electrode and workpiece back face having capacitances and resistances such that chucking charge derived by the chucking voltage is conducted through the dielectric workpiece from its exposed to its unexposed surface during processing of the workpiece so that application by the chucking voltage source of a constant DC chucking voltage to the electrode during processing of the workpiece tends to produce increasing chucking forces on the workpiece as a result of increasing charge trapped in the workpiece, the chucking voltage having a time rate of amplitude change for approximately overcoming the tendency to produce increasing chucking forces on the workpiece during workpiece processing while maintaining the charge applied by the electrode to the workpiece via the insulator sufficiently high to overcome the tendency of the fluid to move the workpiece relative to the chuck during workpiece processing.

36. The apparatus of claim 34 wherein the DC chucking voltage time rate of amplitude change results in decreasing amplitudes of a first polarity voltage being applied to the electrode while the workpiece is being processed.

37. The apparatus of claim 35 wherein the DC chucking voltage source derives a DC voltage having a second polarity opposite to the first polarity, the first polarity DC voltage having a lowest amplitude value, the DC chucking voltage source being programmed to derive the second polarity voltage after the lowest amplitude of the first polarity voltage has been derived.

38. The apparatus of claim 35 further including a monitor for the flow rate of the heat transfer fluid supplied to the workpiece back face, the monitor deriving an output signal for controlling the chucking voltage amplitude, the DC chucking voltage source being connected to be responsive to the output signal.

39. Apparatus for processing a dielectric workpiece comprising a vacuum plasma processor chamber having a metal wall at a reference potential, an electrostatic chuck in the chamber, the chuck including an electrode, a DC chucking voltage source connected to the electrode, a plasma source for processing the workpiece in the chamber, the plasma having sufficiently low electric impedance to cause a front face of the workpiece exposed to the plasma to be at substantially the same potential as the reference potential, a heat transfer fluid source for a back face of the workpiece unexposed to the plasma, the fluid when applied to the workpiece back face having a tendency to move the workpiece relative to the chuck, the chucking voltage having a value for producing a chucking force on the workpiece to overcome the tendency of the fluid to move the workpiece relative to the chuck, the workpiece and an insulator between the electrode and workpiece back face having capacitances and resistances such that chucking charge derived by the chucking voltage is conducted through the dielectric workpiece from its exposed to its unexposed surface during processing of the workpiece so that application by the chucking voltage source of a constant DC chucking voltage to the electrode during processing of the workpiece tends to produce increasing chucking forces on the workpiece as a result of increasing charge trapped in the workpiece, a controller for overcoming the tendency to produce increasing chucking forces on the workpiece during workpiece processing while maintaining the force applied by the electrode to the workpiece via the insulator sufficiently high to overcome the tendency of the fluid to move the workpiece relative to the chuck during workpiece processing.

40. Apparatus of claim 39 wherein a current pulse flows through the electrode as the workpiece is being removed from the chuck, and a current monitor responsive to current of said current pulse, the controller being responsive to said current monitor.

41. Apparatus of claim 39 further including a monitor for the flow rate of the fluid to the workpiece back face, the controller being responsive to said flow rate monitor.

42. Apparatus for processing a dielectric workpiece comprising a vacuum plasma processor chamber having a metal wall at a reference potential, an electrostatic chuck in the chamber, the chuck including an electrode, a DC chucking voltage source connected to the electrode, a plasma source for processing the workpiece in the chamber, the plasma having sufficiently low electric impedance to cause a front face of the workpiece exposed to the plasma to be at substantially the same potential as the reference potential, a heat transfer fluid source for a back face of the workpiece unexposed to the plasma, the fluid when applied to the workpiece back face having a tendency to move the workpiece relative to the chuck, the chucking voltage having a value for producing a chucking force on the workpiece to overcome the tendency of the fluid to move the workpiece relative to the chuck, the workpiece and an insulator between the electrode and workpiece back face having capacitances and resistances such that chucking charge derived by the chucking voltage source migrates between the electrode and the unexposed face across the insulator and through the workpiece during processing of the workpiece so that application by the chucking voltage source of a constant DC chucking voltage to the electrode during processing of the workpiece tends to produce increasing chucking forces on the workpiece as a result of charge trapped in the workpiece, a monitor for effectively detecting the chucking force applied to the workpiece during workpiece processing, and a controller responsive to the chucking force detected by the monitor during workpiece processing for reducing the voltage of the source as a function of time during workpiece processing so the chucking force applied to the workpiece during workpiece processing remains sufficiently high to overcome the tendency of the fluid to move the workpiece relative to the chuck during workpiece processing.

* * * * *